US006403544B1

(12) United States Patent
Davenhall et al.

(10) Patent No.: US 6,403,544 B1
(45) Date of Patent: Jun. 11, 2002

(54) COMPOSITION AND METHOD FOR REMOVING PHOTORESIST MATERIALS FROM ELECTRONIC COMPONENTS

(75) Inventors: Leisa B. Davenhall, Santa Fe; James B. Rubin, Los Alamos, both of NM (US)

(73) Assignee: The Regents of the University of California, Los Alamos, NM (US)

( * ) Notice: Subject to any disclaimer, the term of this patent is extended or adjusted under 35 U.S.C. 154(b) by 116 days.

(21) Appl. No.: 09/621,067

(22) Filed: Jul. 21, 2000

Related U.S. Application Data

(63) Continuation-in-part of application No. 09/216,211, filed on Dec. 18, 1998, now abandoned.
(60) Provisional application No. 60/079,918, filed on Mar. 30, 1998.

(51) Int. Cl.$^7$ .................................................. C11D 3/44
(52) U.S. Cl. ........................ 510/175; 510/176; 510/201; 134/1; 134/1.3; 134/2; 134/158; 134/3; 8/142; 8/158; 430/329; 430/692; 438/48
(58) Field of Search ............................ 134/1, 1.3, 2, 3; 510/175, 176, 201; 8/158, 142; 430/329, 692; 438/48

(56) References Cited

U.S. PATENT DOCUMENTS

| | | | |
|---|---|---|---|
| 4,992,308 A | 2/1991 | Sunol | 427/297 |
| 5,073,267 A * | 12/1991 | Adda et al. | |
| 5,306,350 A | 4/1994 | Hoy et al. | 134/22.14 |
| 5,377,705 A | 1/1995 | Smith, Jr. et al. | 134/95.3 |
| 5,417,768 A | 5/1995 | Smith, Jr. et al. | 134/10 |
| 5,478,673 A | 12/1995 | Funatsu | 429/197 |
| 5,866,005 A * | 2/1999 | DeSimone et al. | |
| 5,866,305 A | 2/1999 | Chon et al. | 430/331 |
| 5,868,856 A | 2/1999 | Douglas et al. | 134/2 |
| 5,873,948 A * | 2/1999 | Kim | |
| 5,908,510 A | 6/1999 | McCullough et al. | 134/2 |

* cited by examiner

Primary Examiner—Yogendra N. Gupta
Assistant Examiner—Gregory E. Webb
(74) Attorney, Agent, or Firm—Samuel L. Borkowsky

(57) ABSTRACT

The invention is a combination of at least one dense phase fluid and at least one dense phase fluid modifier which can be used to contact substrates for electronic parts such as semiconductor wafers or chips to remove photoresist materials which are applied to the substrates during manufacture of the electronic parts. The dense phase fluid modifier is one selected from the group of cyclic, aliphatic or alicyclic compounds having the functional group:

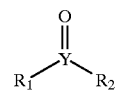

wherein Y is a carbon, oxygen, nitrogen, phosphorus or sulfur atom or a hydrocarbon group having from 1 to 10 carbon atoms, a halogen or halogenated hydrocarbon group having from 1 to 10 carbon atoms, silicon or a fluorinated silicon group; and wherein $R_1$ and $R_2$ can be the same or different substituents; and wherein, as in the case where X is nitrogen, $R_1$ or $R_2$ may not be present. The invention compositions generally are applied to the substrates in a pulsed fashion in order to remove the hard baked photoresist material remaining on the surface of the substrate after removal of soft baked photoresist material and etching of the barrier layer.

16 Claims, 2 Drawing Sheets

COMPOSITION AND METHOD FOR REMOVING PHOTORESIST MATERIALS FROM ELECTRONIC COMPONENTS

This application is a continuation in part of application Ser. No. 09/216,211 now aband. filed Dec. 18, 1998, which claims benefit of provisional application Ser. No. 60/079,918 filed Mar. 30, 1998.

This invention was made with government support under Contract No. W-7405-ENG-36 awarded by the U.S. Department of Energy. The government has certain rights in the invention.

TECHNICAL FIELD

This invention relates to use of dense phase fluids in combination with dense phase fluid modifiers as solvents for removal of polymers and photoresist materials used in the manufacture of semiconductor wafers or chips.

BACKGROUND

During manufacture of integrated circuits, commonly referred to as semiconductor chips or microchips, several iterations of a photolithographic process are used. In this manufacturing process, dielectric, barrier or electrically conducting layers such as silicon dioxide, silicon nitride or metal is first deposited upon a substrate such as a silicon or gallium arsenide wafer by any of several suitable processes such as thermal oxidation, chemical vapor deposition, sputtering, ion implantation or vacuum evaporation.

After formation or deposition of the dielectric, barrier or conducting layer, a photoresist material is applied to the wafer by any suitable means including, but not limited to, spinning of the wafer to distribute liquid photoresist evenly on the surface of the wafer.

Usually the photoresist material coated wafer is then heated in a "soft bake" or prebake step to improve adhesion of the photoresist material to the substrate surface and/or the barrier layer and to remove solvent from the generally polymeric photoresist material.

After the photoresist is soft baked onto the barrier layer, portions of the soft baked photoresist coated wafer are selectively exposed to high energy light such as high intensity ultraviolet light in a desired pattern defined by a photomask. Developing agents are then used to develop the portions of the photoresist material which were exposed to the high energy light.

When positive photoresist materials are used, the developed portions of the photoresist materials are solubilized by the exposure to the light and development and then are washed away, leaving portions of the dielectric or conducting layer coated wafer exposed and other portions of the wafer coated with dielectric or conducting layer underneath the remaining, unexposed and undeveloped photoresist layer.

Conversely, when negative photoresist materials are used, the undeveloped portions of the photoresist materials are selectively removed for exposing selected portions of the barrier material coated substrates in the desired patterns.

Once the pattern of photoresist has been established on the wafer, the wafer is "hard baked" to densify and toughen the photoresist material and improve adhesion to the dielectric or conducting layer. The exposed substrate and/or barrier material is then etched (removed) by any of several suitable methods, depending upon which materials were used as the dielectric or conducting layer. Wet chemical etching, dry etching, plasma etching, sputter etching or reactive-ion etching processes may be used. The etching processes remove barrier material which is unprotected by photoresist, leaving both portions of bare wafer and portions of wafer having layered coatings of barrier layer and the photoresist material which protected the barrier layer underneath from the etching process on the surface of the wafer.

The wafer having on its surface the pattern of dielectric or conducting layer material coated with photoresist material is then treated in an aggressive step to remove the hard baked photoresist material from the remaining pattern of barrier layer material. This has traditionally been done using solvent washes of halogenated hydrocarbons, mixtures of sulfuric acid and hydrogen peroxide, or highly alkaline mixtures of hydroxides with activators. Use of any of these solvent mixtures produces high volumes of undesirable liquid waste streams.

After removal of the hard baked photoresist material, in a final step, the substrate with the patterned surface layer on it is washed with deionized water to ensure that all traces of photoresist removal solvents are removed from the wafer surface.

This photolithographic process is repeated as many times as needed to produce as many layers of different patterns of dielectric, barrier or conducting layer material upon the substrate as desired. Layers of either positive or negative photoresist material can be used in various combinations on the same wafer.

There is a need for methods for effectively removing photoresist materials in ways that reduce the amount of undesirable waste streams.

Therefore it is an object of this invention to provide a method of removing photoresist materials used in the manufacture of integrated circuits or other electronic components such as circuit boards, optical waveguides and flat panel displays.

It is another object of this invention to provide a method of reducing undesirable waste streams produced during manufacture of integrated circuits or other electronic components.

It is also an object of this invention to provide a method of manufacturing integrated circuits which eliminates the need for the final aqueous rinse step.

It is a further object of this invention to provide solvents useful for dissolving polymers used as photoresist materials.

It is yet another object of this invention to provide an apparatus for removing photoresist materials from substrates for integrated circuit or other electronic components.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims. The claims appended hereto are intended to cover all changes and modifications within the spirit and scope thereof.

DISCLOSURE OF INVENTION

To achieve the foregoing and other objects, and in accordance with the purposes of the present invention, as embodied and broadly described herein, a combination of at least one dense phase fluid and at least one dense phase fluid modifier is used to contact substrates for electronic parts such as semiconductor wafers or chips to remove photoresist materials which are applied to the substrates during manufacture of the electronic parts. The dense phase fluid modifier is one selected from the group of cyclic, aliphatic or alicyclic compounds having the functional group:

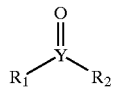

wherein Y is a carbon, oxygen, nitrogen, phosphorus or sulfur atom or a hydrocarbon group having from 1 to 10 carbon atoms, a halogen or halogenated hydrocarbon group having from 1 to 10 carbon atoms, silicon or a fluorinated silicon group; and wherein $R_1$ and $R_2$ are substituents selected from the group of hydrogen, hydrocarbon groups having from 1 to 10 carbon atoms, halogen, and halogenated hydrocarbon groups having from 1 to 10 carbon atoms, silicon, fluorinated silicon groups; and wherein $R_1$ and $R_2$ can be the same or different substituents; and wherein, as in the case where Y is nitrogen, $R_1$ or $R_2$ may not be present.

The invention compositions generally are applied to the substrates in a pulsed fashion in order to remove the hard baked photoresist material remaining on the surface of the substrate after removal of soft baked photoresist material and etching of the barrier layer.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

BEST MODES FOR CARRYING OUT THE INVENTION

Figure 1:
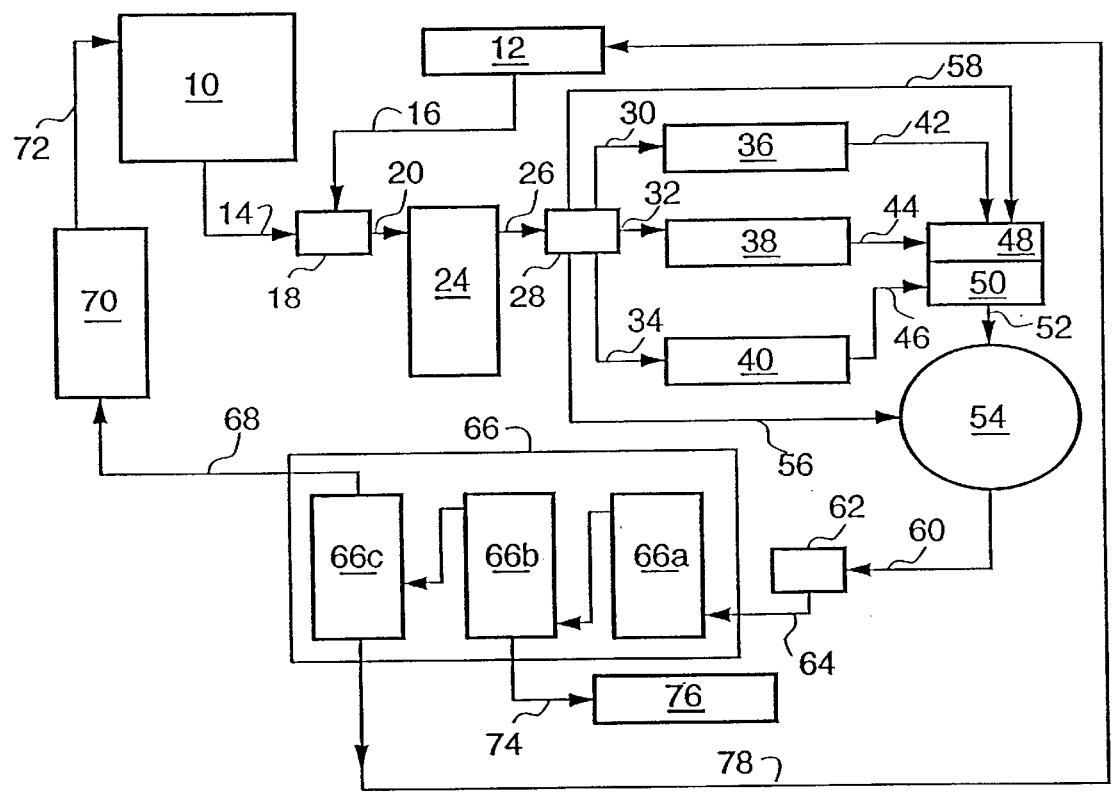
FIG. 1 is a schematic diagram of an invention setup for contacting a substrate having thereon photoresist material with a mixture of dense phase fluid and dense phase fluid modifier in accordance with the invention process.

There has been discovered a novel composition for and manner of removing hard baked photoresist materials from substrates which have been coated with a dielectric, barrier or conducting layer and photoresist materials, preheated, selectively photo-exposed and developed, etched and hard baked during the manufacture of electronic components including integrated circuits and circuit boards.

At the beginning of the final step of the photolithographic process commonly used for manufacturing integrated circuits and circuit boards, a pattern of layers of dielectric, barrier or conducting material and hard baked photoresist material which has protected the dielectric, barrier or conducting material during the etching step of the photolithographic process remain on the substrate. In accordance with this invention, the hard baked photoresist material is removed by contacting it with a mixture of at least one dense phase fluid and at least one dense phase fluid modifier. Pulsed contact is generally the presently preferred method of contacting the photoresist material with the invention mixtures, although other contact protocols can be successfully employed.

Dense phase fluid in a liquid state is most conveniently used as a starting component, but for purposes of the present invention it is subjected to pressures and temperatures sufficiently high to maintain the fluid in a supercritical state, behaving simultaneously like a liquid (in density) and a gas (in diffusivity) and able to dissolve the dense phase fluid modifier. The necessary pressure and temperature will depend upon which dense phase fluid is used.

Dense phase fluids which are useful in the present invention are those in which the selected modifiers will dissolve in sufficient quantities to effectively remove photoresist materials. These include, but are not limited to, carbon dioxide, argon, helium, nitrogen, ethane, methane, propane and butane. Presently most preferred is carbon dioxide because it is non-flammable, non-toxic, has easily achievable critical conditions, and is an excellent solvent for Lewis bases.

An amount of dense phase fluid sufficient to dissolve the selected amount of modifier and adequate to contact the area of photoresist material to be removed is needed. An amount of dense phase fluid in the range from about 70 to about 99.9 volume percent is generally useful in the invention. More preferable is an amount of dense phase fluid in the range from about 80 to about 99.9 volume percent. Generally presently preferred is an amount of dense phase fluid in the range from about 90 to about 99.8 volume percent. Use of too little dense phase fluid will result in the necessity of unacceptably long times to remove photoresist material because of insufficient flow rates in the process caused by lack of fluidity of the dense phase fluid modifier. Use of too much dense phase fluid will cause unacceptably long times for removal of the photoresist because of having insufficient amount of the modifier to break down the chemical bonds in the photoresist material.

Dense phase fluid modifiers which are useful in the practice of the invention are those which enhance Lewis base properties of the dense phase fluid mixture and which are soluble in the selected dense phase fluid. Generally presently preferred as dense phase fluid modifiers have relatively high boiling points, low toxicity, solubility in the dense phase fluid, and chemically interact effectively at the interfaces of the photoresist material and the substrate, or at polymer to polymer interfaces by interrupting molecular bonding.

Compounds useful as dense phase fluid modifiers in the invention are those selected from the group of:

(i) cyclic compounds having the functional group

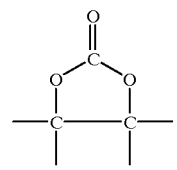

(ii) aliphatic or alicyclic compounds having the functional group

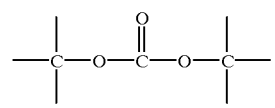

(iii) cyclic compounds having the functional group

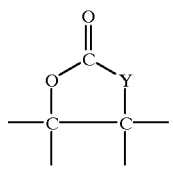

wherein Y is a carbon, oxygen, nitrogen, phosphorus or sulfur atom or a hydrocarbon group having from 1 to 10 carbon atoms, a halogen or halogenated hydrocarbon group having from 1 to 10 carbon atoms, silicon or a fluorinated silicon group;

(iv) aliphatic or alicyclic compounds having the functional group

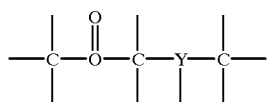

wherein Y is a carbon, oxygen, nitrogen, phosphorus or sulfur atom or a hydrocarbon group having from 1 to 10 carbon atoms, a halogen or halogenated hydrocarbon group having from 1 to 10 carbon atoms, silicon or a fluorinated silicon group;

(v) sulfoxides within the formula:

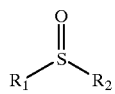

wherein $R_1$ and $R_2$ are substituents selected from the group of hydrogen, hydrocarbon groups having from 1 to 10 carbon atoms, halogen, and halogenated hydrocarbon groups having from 1 to 10 carbon atoms, silicon, fluorinated silicon groups; and wherein $R_1$ and $R_2$ can be the same or different substituents.

Generally, dense phase fluid modifiers presently preferred include, but are not limited to, esters within the formula:

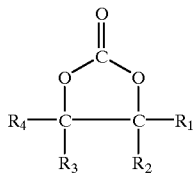

wherein $R_1$, $R_2$, $R_3$, and $R_4$ are substituents selected from the group of hydrogen, hydrocarbon groups having from 1 to 10 carbon atoms, halogens, and halogenated hydrocarbon groups having from 1 to 10 carbon atoms; and wherein each of $R_1$, $R_2$, $R_3$, and $R_4$ can be the same or different substituents;

and esters within the formula:

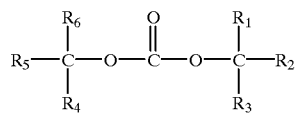

wherein $R_1$, $R_2$, $R_3$, $R_4$, $R_5$ and $R_6$ are substituents selected from the group of hydrogen, hydrocarbon groups having from 1 to 10 carbon atoms, halogens, and halogenated hydrocarbon groups having from 1 to 10 carbon atoms; and wherein each of $R_1$, $R_2$, $R_3$, $R_4$, $R_5$ and $R_6$ can be the same or different substituents.

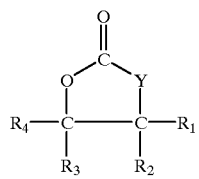

wherein Y is a carbon, oxygen, nitrogen, phosphorus or sulfur atom or a hydrocarbon group having from 1 to 10 carbon atoms, a halogen or halogenated hydrocarbon group having from 1 to 10 carbon atoms, silicon or a fluorinated silicon group; and wherein $R_1$, $R_2$, $R_3$, and $R_4$ are substituents selected from the group of hydrogen, hydrocarbon groups having from 1 to 10 carbon atoms, halogen, and halogenated hydrocarbon groups having from 1 to 10 carbon atoms, silicon, fluorinated silicon groups; and wherein $R_1$ $R_2$, $R_3$, and $R_4$ can be the same or different substituents; and wherein, as in the case where Y is nitrogen, $R_1$ or $R_2$ may not be present.

esters within the formula:

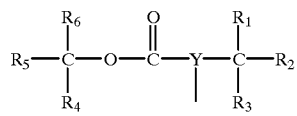

wherein Y is a carbon, oxygen, nitrogen, phosphorus or sulfur atom or a hydrocarbon group having from 1 to 10 carbon atoms, a halogen or halogenated hydrocarbon group having from 1 to 10 carbon atoms, silicon or a fluorinated silicon group; wherein $R_1$, $R_2$, $R_3$, $R_4$, $R_5$ and $R_6$ are substituents selected from the group of hydrogen, hydrocarbon groups having from 1 to 10 carbon atoms, halogen, and halogenated hydrocarbon groups having from 1 to 10 carbon atoms, silicon, fluorinated silicon groups; and wherein $R_1$, $R_2$, $R_3$, $R_4$, $R_5$ and $R_6$ can be the same or different substituents;

and sulfoxides within the formula:

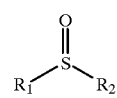

wherein $R_1$ and $R_2$ are substituents selected from the group of hydrogen, hydrocarbon groups having from 1 to 10 carbon atoms, halogens, and halogenated hydrocarbon groups having from 1 to 10 carbon atoms, silicon, fluorinated silicon groups; and wherein $R_1$ and $R_2$ can be the same or different substituents.

The cyclic esters are generally considered more useful because there is less likelihood of steric hinderance than would be present with open chain esters.

Presently preferred dense phase fluid modifiers include, but are not limited to, propylene carbonate (1,3-dioxalane-2-one,4-methyl), ethylene carbonate, butylene carbonate, 1-methyl-2-pyrrolidinone, dimethyl sulfoxide, gamma-butyrolactone (2,4-dioxalane-3-one) and propylene glycol methyl ether acetate.

Dense phase fluid modifiers which are completely soluble in the selected dense phase fluid are particularly useful because complete solubility in the dense phase fluid facilitates removal of all of the modifier from the surface being treated along with the dense phase fluid in a single step.

An amount of dense phase fluid modifier sufficient to break the chemical bonds in the photoresist polymer to the extent necessary for removal of the photoresist material is needed. An amount of dense phase fluid modifier in the range from greater than zero to about 30 volume percent is generally useful in the invention. More preferable is an amount of dense phase fluid modifier in the range from about 0.1 to about 20 volume percent. Generally presently preferred is an amount of dense phase fluid modifier in the range from about 0.2 to about 10 volume percent. Use of too little dense phase fluid modifier will result in insufficient reactivity with the photoresist material to adequately break down the hardbaked photoresist material. Use of too much dense phase fluid modifier will cause slower throughput times in the process and loss of economic advantage because of the much higher temperatures and pressures needed to keep the solvent system in the supercritical phase with high diffusion constants.

When a dense phase fluid modifier is virtually completely soluble in the supercritical fluid, a solvent solution which stays in a single supercritical phase is formed.

The mixture of dense phase fluid and dense phase fluid modifier which forms the single supercritical phase of invention solvent is prepared by combining selected amounts of each of the components while maintaining sufficient pressure and temperature to keep the fluid in a single phase supercritical state. A wide range of pressures and temperatures can be used to maintain the components in a single phase supercritical phase, depending upon the selection of components. For example, when carbon dioxide is selected as the dense phase fluid and propylene carbonate is selected as the dense phase fluid modifier, a pressure of at least 1080 psi and a temperature of at least 31° C. are needed on both the dense phase fluid and the dense phase fluid modifier.

The modified supercritical fluid solutions of this invention are believed to have no effect on the commonly used metallization materials and are therefore fully compatible with existing integrated circuit manufacture.

Minor amounts of other additives can be used in the modified supercritical fluid solvent system of this invention when desired to further enhance the process by modifying the viscosity, thermal conductivity, polarity and/or critical point of the resultant fluid. Other additives which may be used in the practice of the invention include, but are not limited to, propylene glycol methyl ether, dipropylene glycol methyl ether, diethyl carbonate, and isobutylisobutyrate. Argon or hydrogen can be used to enhance thermal conductivity. Ammonia can be used to increase polarity of the invention mixture. Water can be used to increase polarity, enhance solubility of the system, and thermal transfer.

The substrates having patterned coatings of dielectric, barrier or conducting material and hard baked photoresist material can be first contacted with the selected invention composition components in the selected proportionate amounts in a soaking period. During the soaking period the coated substrates are immersed in the static supercritical fluid mixture at a temperature and pressure sufficient to keep the fluid mixture in the supercritical phase.

During the soaking period, if a soaking period is employed, when the high pressure vessel is simply filled with the invention fluid, the pressure is held in the range from about 500 psi to about 10,000 psi.

Generally, temperatures in the range from about 0° C. to about 300° C. are useful in the practice of the invention employing most of the dense phase fluids and most of the dense phase fluid modifiers. Generally more preferred are temperatures in the range from about 15° C. to about 200° C. Presently most preferred, particularly when using carbon dioxide as the dense phase fluid and propylene carbonate as the dense phase fluid modifier, are temperatures in the range from about 40° C. to about 100° C.

The coated substrates can then be contacted by sequenced pressure driven pulses of the invention supercritical fluid mixture at temperatures which maintain the fluid in a supercritical state. The pressure sequences are generally pulses of fluid at high pressures followed intersticially by periods of time in which the pressure of the fluid in contact with the coated substrate being treated is allowed to drop to a lower, but still elevated, pressure. The high pressure pulses of fluid presently preferred are generally in the range from about 550 to about 10,500 psi in order to contact the coated substrate with sufficient force to remove the solubilized or softened photoresist materials. Presently more preferred are high pressure pulses of fluid in the range from about 1,500 to about 5,000 psi, depending upon which solvent solution components are used and upon temperatures employed. Presently most preferred when using carbon dioxide as the dense phase fluid and propylene carbonate as the dense phase fluid modifier are high pressure pulses of fluid in the range from about 2,000 to about 4,000 psi.

During the lower pressure periods of contact, the invention fluid is generally at a pressure in the range from about 500 to about 10,000 psi. Presently more preferred are low pressure periods of fluid at a pressure in the range from about 1,100 psi to about 2,000 psi.

During both the soaking period and the lower pressure periods of contact, the modified supercritical fluid of the invention causes the hard baked photoresist material to soften and debond from the electrically conductive barrier layer on the substrate.

During the high pressure pulsed times when the pressure of the invention solution contacting the coated substrate is significantly increased, the softened and debonded photoresist materials are dissolved and washed away from the coated substrate by the invention solution.

After the photoresist is removed to a level consistent with or better than existing wafer industry standards, a final rinse of the substrate can be made with unmodified liquid or supercritical fluid to remove any residual modifier.

Any suitable means of producing the pulsating flow of the invention composition can be used, including, but not limited to, pressure pump, ballast tank, chopped flow device and pressure differential valving.

One particular means of providing sequenced pulses of fluid at selected pressures is the subject invention of U.S. Pat. No. 6,085,762 issued Jul. 11, 2000. That invention comprises: reservoirs for the dense phase fluid and the dense phase fluid modifier; valved conduits connecting each of the reservoirs to a pumping means; a conduit with control valves from the pumping means to one or more ballast tanks with the control valves able to sequentially or intermittently direct a flow of fluid into each of the ballast tanks; conduits from each of the ballast tanks to a control valve and injection valve which injects fluid from the conduits from each of the ballast tanks into a high pressure processing vessel where the substrates are contacted with the fluid in order to remove the photoresist material. Additionally, there may be direct conduits from the control valves which are connected to the one or more ballast tanks to the high pressure processing vessel to provide a means for conducting a flow of only dense phase fluid or a direct unpulsed flow of the single phase invention mixture directly into the high pressure processing vessel, bypassing the ballast tanks.

Alternatively, other sequences of contact of the invention fluids with the photoresist material can be used. For example, rather than continuously pulsing the invention fluids across the photoresist material to be removed, a series of soaking baths can be used.

If desired, the mixture of dense phase fluid, dense phase fluid modifier and dissolved photoresist material can simply be conducted away from the process and treated, stored or transported as needed.

For recycling the processing fluid in the above described preferred embodiment, a conduit from the high pressure processing vessel can be connected to a separator vessel, a multi-unit separator vessel, or more than one separator vessel connected in series. In the separator vessel or vessels, the mixture of dense phase fluid and dense phase fluid modifier with dissolved photoresist materials in it can be processed in any of several ways, depending upon the products desired, economic factors, and equipment, space and engineering capabilities.

In a first scenario, a single separator vessel could be used to contain the mixture while adjusting the temperature and pressure to values at which the photoresist material is no longer soluble and precipitates out. The remaining dense phase fluid and dense phase fluid modifier would then be recycled together.

In a second scenario, a separator vessel or compartment of a separator vessel can be used to contain the mixture while reducing the pressure and increasing the temperature to values at which the supercritical dense phase fluid would boil off leaving a mixture of the dense phase fluid modifier and photoresist material. The dense phase fluid (then in a gas phase) is recondensed to liquid and reused in the process. The dense phase fluid modifier and photoresist material would then be separated in another vessel or compartment of a single separator vessel.

In a third, presently preferred scenario, a multi-unit separator vessel is used to first adjust the temperature and pressure of the mixture so that the photoresist material is no longer soluble and precipitates out, then in a second unit the dense phase fluid is boiled off the dense phase fluid modifier by reduction of pressure and increasing of temperature.

As needed, conduits are provided whereby the dense phase fluid modifier can be directed to a means for separating the dissolved photoresist material, then returning the cleaned dense phase fluid modifier to the dense phase fluid modifier reservoir for reuse in the invention process or conducting the dense phase fluid modifier elsewhere for other purposes.

As needed, conduits are also provided as means for the vaporized supercritical fluid to be conducted to a condenser where it is condensed, then returned to the dense phase fluid reservoir for reuse in the invention process or conducted elsewhere for other purposes.

Generally, the number of ballast tanks needed is that number sufficient to render the process as continually efficient as possible by providing a reliable, ready source of pressurized supercritical fluid at any time needed by simply alternating choice of tank.

An example of an embodiment of the invention in which such an apparatus with three ballast tanks is employed to remove photoresist material from coated substrates is shown schematically in FIG. 1.

With reference to FIG. 1, separate reservoirs 10 and 12 are provided for the dense phase fluid and the dense phase fluid modifier, respectively. These reservoirs can also function as long term storage facilities for these components. Alternatively, a single reservoir can be used to contain a mixture of dense phase fluid and dense phase fluid modifier.

A conduit 14 connects the dense phase fluid reservoir 10 with a control valve 18 which admits selected proportionate amounts of the dense phase fluid with amounts of dense phase fluid modifier dispensed from the dense phase fluid modifier reservoir 12 through a conduit 16 to the control valve 18. The control valve 18 is connected by a conduit 20 to a high pressure pump 24. A separate conduit 22 can be run from the dense phase fluid reservoir 10 into the control valve 18 for purposes of dispensing unmodified dense phase fluid into the conduit 20 when it is desired to flush the system or do a final rinse step with unmodified dense phase fluid.

The high pressure pump 24 has the capability of producing the desired fluid pressure and creating high volume flow.

The wafers to be treated are positioned and held in a high pressure process vessel 54 by any suitable means. For example, the wafers can be attached to a shelf which is suspended in the high pressure process vessel 54 by brackets. The wafers are placed so that the pulses of fluid impact directly onto the photoresist material to be removed.

The high pressure process vessel 54 is isolated and depressurized for placing wafers into and removing wafers from the high pressure process vessel 54.

Using the apparatus of this embodiment, a first soaking step may be employed to soften and begin dissolution of the photoresist material. If it is desired to employ a soaking step, the high pressure pump 24 is used to pump an invention mixture of dense phase fluid and dense phase fluid modifier having the proportionate amounts of components dispensed by the control valve 18 through a conduit 56 directly into the high pressure processing vessel 54. The high pressure processing vessel 54 is maintained at sufficiently high temperature and pressure to keep the invention solvent mixture in supercritical phase.

In such a soaking step, the wafers are allowed to soak in the static supercritical mixture in the high pressure process vessel 54 for a period of time in the range from about 30 seconds to about 10 minutes to soften and/or generally degrade the photoresist material which is to be removed.

The high pressure pump 24 is then employed to pump the selected invention mixture of dense phase fluid and dense phase fluid modifier through a conduit 26 into a control valve 28 which is capable of sequentially or intermittently releasing pre-determined portions of the mixture of dense phase fluid and dense phase fluid modifier through each of three conduits 30, 32 and 34. Three different contacts in the control valve 28 can be electronically activated to control the pressure of the mixture released into each of the three conduits 30, 32 and 34.

Each of the three conduits 30, 32 and 34 are connected to one of three ballast tanks 36, 38 and 40. Generally it is preferred to have at least one of the ballast tanks being fully pressurized while pressure is being released from at least one other of the ballast tanks by having fluid from it going into a multiport control valve 48 which will inject the fluid through an injection valve 50 and conduit 52 into a high pressure process vessel 54.

For example, still with reference to FIG. 1, when pressurized fluid is coming from conduit 30 into ballast tank 36 pressurizing ballast tank 36, the valve 48 is closing off the conduit 42 from ballast tank 36; meanwhile, pressurized fluid from ballast tank 38 is simultaneously being released through conduit 44 into the multiport control valve 48 which is allowing the pressurized fluid from ballast tank 38 to pass into the injection valve 50 for injection into the high pressure process vessel 54. In this example, ballast tank 40 may be getting pressurized with fluid from conduit 34 with the associated conduit 46 to the multiport control valve 48 closed off during pressurization. Alternatively, depending upon need for pressure to produce the desired intervals and pressures for the pulses of fluid entering the high pressure process vessel 54, fluid may be getting released from ballast tank 40 through conduit 46 into the multiport control valve 48 for injection through the injection valve 50 into the high pressure process vessel 54.

In this embodiment the invention supercritical fluid mixture is pumped at high pressure pulses alternating with low pressure pulses across the surface of substrates with photoresist coating. When the apparatus described is used, the length of the pressure pulses is the time necessary to reduce the amount of pressure in whichever ballast tank is dispensing the pressure pulse to reach equilibrium with the pressure in the high pressure process vessel 54. When other means of pulsing the supercritical fluid mixture across the surfaces of the wafers is employed, then pulse lengths in the range from about 5 seconds to about 1 minute are generally preferred, depending upon the concentration of modifier in the supercritical fluid and the pressures chosen for the pulses.

Invention fluid mixture which has been used to contact the photoresist material on substrates in the high pressure process vessel 54 is then conducted away from the high pressure process vessel 54 after each pulse of invention fluid mixture against the wafers in the high pressure process vessel 54. This is accomplished by opening control valve 62 on conduit 60, releasing built up pressure in the high pressure process vessel 54 until the pressure in the high pressure process vessel 54 is back down to the soaking period pressure level.

The substrates with photoresist coating are treated with pulses of invention single phase supercritical solvent mixture in the high pressure process vessel for a period of time sufficient to allow complete removal of the photoresist material. Depending upon the pressure, temperature, speed and volume of the pulses and the proportionate amounts of dense phase fluid and dense phase fluid modifier, a period of at least about a minute generally is needed. A period of time longer than about 30 minutes is not generally necessary if the other factors are optimized.

With this release of pressure from the high pressure process vessel 54, the fluid mixture conducted away from the high pressure process vessel 54 through conduit 60 having thereon a valve 62 is transported by conduit 64 into a separator vessel 66.

The separator vessel 66 can be in any suitable configuration needed to separate the dense phase fluid from the dense phase fluid modifier which has the photoresist material dissolved therein, and also, if desired, to separate the dissolved photoresist material from the dense phase fluid modifier. One example of a useful separator vessel 66 is a three-stage multistage separation unit with means for separately controlling the heat for each of three sections 66a, 66b, and 66c, of the separator vessel 66.

In this example of a separator vessel, first section 66a of the multistage separation unit 66 is used for preheating the invention supercritical fluid mixture containing the dissolved photoresist material. After the temperature is increased to a temperature high enough to allow the single phase miscible mixture of the dense phase fluid and the dense phase fluid modifier to "boil off" of the photoresist material, the mixture passes into a second section 66b of the separation unit.

In the second section 66b of the separation unit 66 of this example, the pressure is sufficiently controlled to allow the photoresist material to precipitate out of the single phase miscible mixture of the dense phase fluid and the dense phase fluid modifier. The photoresist material precipitates out of the miscible mixture of the dense phase fluid and the dense phase fluid modifier because of the inability of the single phase miscible mixture to hold the photoresist material in solution at the reduced pressure.

Then a third section 66c of the multistage separation unit 66 of this example is used for separation of the dense phase fluid from the dense phase fluid modifier. In the third section 66c the temperature and/or pressure are still further controlled in order for the differential in vapor pressures of the two fluids to cause separation of the two fluids into two phases.

Depending upon which dense phase fluid is selected, the separator vessel 66 is maintained at a temperature in the range from about 0° C. to about 100° C. For example, when using carbon dioxide as the dense phase fluid and propylene carbonate as the dense phase fluid modifier, the separator vessel 66 is maintained at a temperature in the range from about 0° C. to about 25° C. When a multistage separator vessel is used, this step is accomplished in the first 66a stage of the separator vessel 66.

The decrease in pressure causes the supercritical or subcritical component of the dense phase fluid mixture to separate and leave the separator vessel 66 as a gas through a conduit 68. The conduit 68 empties the gas phase fluid into a condenser 70 where the gas phase fluid is liquefied. The liquefied dense phase fluid can then be returned through conduit 72 to the dense phase fluid reservoir 10 for reuse in the invention process if desired. Alternatively, the dense phase fluid can be removed from the reactor loop.

A means 66b for separating dissolved or mechanically carried photoresist material from the dense phase fluid modifier can be incorporated in the separator vessel 66. In this example, the dense phase fluid modifier from which the photoresist material has been removed is then returned through conduit 78 to the dense phase fluid modifier reservoir 12 if desired. Any separated photoresist material is conducted to a means 76 for collecting the separated photoresist material by conduit 74. Alternatively, the dense phase fluid modifier with dissolved photoresist material can be pumped from the separator unit 66 and removed from the reactor loop for separation at a remote unit.

After treatment of the coated substrates with a sufficient number of pulses of invention fluid mixture to remove the photoresist, a final unmodified fluid rinse of the substrate wafers is made by pumping unmodified dense phase fluid from the dense phase fluid reservoir 10 through the "three-way" valve 28, thence through a separate conduit 58, bypassing the ballast tanks, directly into the multiport control valve 48 for injection into the high pressure process vessel 54.

Use of the invention compositions, processes and apparatuses makes unnecessary the final step in which the substrate with the patterned dielectric, barrier or conducting layer on it is washed with deionized water to ensure that all traces of organic solvents and sulfates are removed from the wafer surface. The invention fluid solution does not leave behind any of the dense phase fluid modifier since the dense phase fluid modifier is completely soluble in the supercritical fluid.

The invention compositions and method of removing photoresist materials from coated substrates in the manufacture of electronic components such as integrated circuits are fully compatible with wafer metallizations used as conductive layers and substrates. Although organic stripping solvents not in accordance with the invention are compatible with most presently used wafer metallizations and substrates, they are considered hazardous, potentially harmful to workers and the environment and difficult or expensive to handle. Acidic and alkaline solutions and chilled ozone solutions which have been used for removal of photoresist materials are generally compatible with wafer substrates but corrode metallizations. Plasmas used for removal of photoresist materials can damage pre-fabricated gates and the substrate, can oxidize the wafer substrate surface and corrode metallization materials. Thus the invention compositions and processes are considered superior to the existing technology.

The following examples will demonstrate the operability of the invention.

EXAMPLE I

Figure 2:
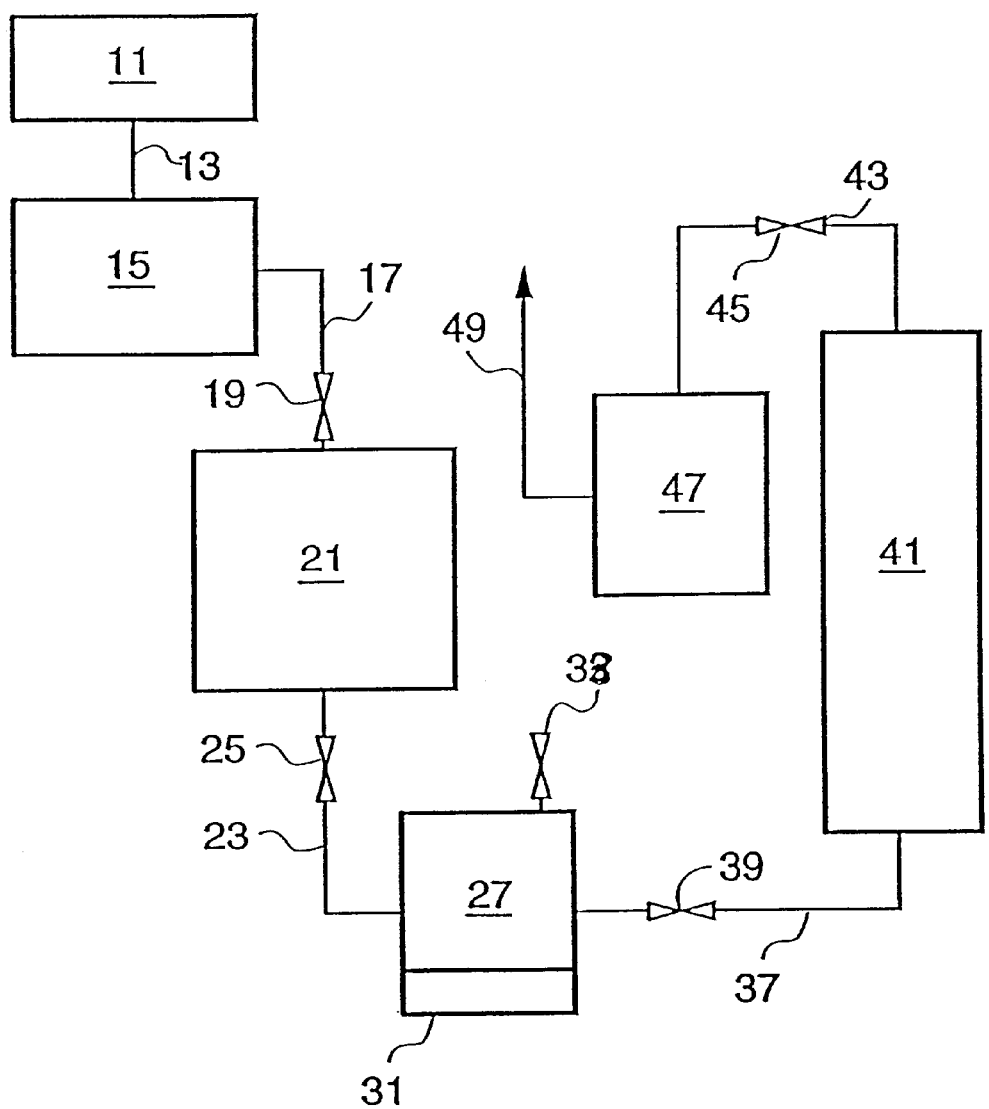
FIG. 2 is a schematic of an equipment set up to demonstrate operability of the invention.

For making the invention run described in this example, equipment was set up in the manner shown in the schematic of FIG. 2.

Carbon dioxide was used as the dense phase fluid and propylene carbonate was used as the dense phase fluid modifier for removing photoresist material from the silicon substrate of a semiconductor chip wafer.

A mixture of 5% propylene carbonate and 95% carbon dioxide supplied by Scott Specialty Gases, Inc., in a standard size A syphon cylinder was used as feed material for a propylene carbonate and carbon dioxide reservoir 11. The pressure in the syphon cylinder was approximately 900 psi at room temperature, which was sufficient to maintain the contents in liquid form.

The propylene carbonate and carbon dioxide reservoir 11 was connected by a conduit 13 to an ISCO™ 260D syringe pump 15 which was in turn connected by conduit 17 to a Whitey™ 304L-HDF4 1000 cc high pressure sample cylinder which served as a ballast tank 21. The conduit 17 between the syringe pump 15 and the ballast tank 21 had a pressure relief valve 19.

On the downstream side of the ballast tank 21 a ¼" outside diameter stainless tubing conduit 23 connected the ballast tank 21 to a DUR-O-LOK™ quick opening high pressure filter housing which was modified to serve as a cleaning vessel 27. The DUR-O-LOK™ filter housing, manufactured by C. F. Technologies, was modified by addition of a pressure relief port and machining of the inside of the vessel to allow for tie-down points for the special wafer holding arrangement. The modified vessel was recertified to meet A.S.M.E. Code, Sec. VIII, Div. 1 standards.

A positioning fixture was designed for holding the silicon wafers in the cleaning vessel 27. The wafer positioning fixture was a stainless steel disc of approximately 2 inches in diameter that was counterbored to accept a second disc which had the wafer mounted in it.

The active volume of the cleaning vessel 27 was approximately 320 cc.

The high pressure input through conduit 23 to the cleaning vessel 27 was positioned to allow for the injection of the dense phase fluid mixture directly onto the surface of the silicon wafers.

A high wattage heater 29, thermocouple 31, pressure vent valve 33 and pressure relief valve 35 were installed on the quick opening high pressure filter housing being modified to serve as the cleaning vessel 27.

High pressure tubing (304 stainless steel rigid tubing and Swagelok™ flexible teflon bore stainless overbraided tubing) was used as a conduit 37 for connecting the cleaning vessel 27 with a high pressure filter housing manufactured by Autoclave Engineers which was modified to serve as a surge tank 41. A precision micrometer bellows needle valve 39 was installed in the conduit 37 to allow for the controlled release of excess pressure from the cleaning vessel 27 while maintaining the cleaning vessel 27 pressure above the critical point.

The high pressure filter housing which was modified to serve as the surge tank 41 had a 2-liter volume and allowed for ample expansion of pressure from the cleaning vessel 27.

A conduit 43 with a valve thereon connected the surge tank 41 with a 5-liter tank which was adapted to serve as a water bubbler 47 to trap the propylene carbonate from the gaseous mixture being released from the surge tank 41. A conduit 49 from the water bubbler 47 conducted cleaned carbon dioxide away from the water bubbler 47 where it could be released into the atmosphere. Water with propylene carbonate in solution was removed from the water bubbler 47 as needed.

Before pressurization was started for this demonstration run, the ballast tank 21 and the cleaning vessel 27 were preheated to 50° C. Two variable voltage transformers were used to control separately the temperatures of the ballast tank 21 and the cleaning vessel 27.

The carbon dioxide and propylene carbonate mixture was flowed into the system and allowed to fill the high pressure syringe pump 15, the ballast tank 21 and the cleaning vessel 27. The resulting pressure was approximately 900 psi and the fill took about two full minutes.

Once the fill was complete, the high pressure syringe pump 15 was used to bring the cleaning vessel 27 and the ballast tank 21 up to approximately 1100 psi, which was critical pressure. Then the valve 25 between the ballast tank 21 and the cleaning vessel 27 was closed and the pump 15 was operated for about 5 minutes to pressurize the ballast tank 21 to approximately 1600 psi. This five-minute period became the "wafer soak time" used in the cleaning vessel 27.

Once the ballast tank 21 was pressurized to 1600 psi, the valve 25 was opened to release the pressure into the cleaning vessel 27. The difference in pressures in the ballast tank 21 (1600 psi) and the cleaning vessel 27 (1100 psi) caused the dense phase fluid mixture of carbon dioxide and propylene carbonate to spray directly onto the wafers with high pressure and high velocity, thereby removing photoresist from the wafers. The photoresist was believed to be going into solution in the dense phase fluid mixture of carbon dioxide and propylene carbonate.

The pressure in the ballast tank 21 and the cleaning vessel 27 was allowed to equilibrate, equalizing at approximately 1400 psi. After equilibration of the ballast tank 21 and cleaning vessel 27 pressures, the downstream micrometer bellows valve 39 was opened for a time (about 1 minute)

sufficient to allow the ballast tank 21 and cleaning vessel 27 pressures to drop to 1100 psi.

Then the micrometer bellows valve 39 and the valve 25 between the ballast tank 21 and the cleaning vessel 27 were closed. With the micrometer bellows valve 39 and the valve 25 between the ballast tank 21 and the cleaning vessel 27 closed, the high pressure syringe pump 15 was reactivated to repressurize the ballast tank 21 to repeat the above described procedure with another pressure pulse across the silicon wafers in the cleaning vessel 27. The procedure was repeated a total of three times.

After the three pressure pulses had been completed, the entire system was depressurized and the special fixture holding the silicon wafer was removed from the cleaning vessel 27 and rinsed with deionized and filtered water.

Analysis of the silicon wafer showed that substantially all photoresist material had been removed from the wafer.

EXAMPLE II

A set of runs were made for purposes of comparison of use of unmodified supercritical carbon dioxide, modifier alone, and combinations of supercritical carbon dioxide and modifier using varied temperature, pressure and contact conditions. The compositions and contact conditions of these runs are shown in Table I.

In Runs 5, 6 and 7, a mixture of 5% propylene carbonate and 95% carbon dioxide, supplied by H.P. Gas Products, Inc., was delivered by the pump to an ISCO™ SFX-2-10 supercritical fluid extractor, then 100% carbon dioxide was sequentially delivered by the pump to a large scrub reactor.

In Runs 8 through 12, a mixture of 5% propylene carbonate and 95% carbon dioxide, supplied by Scott Specialty Gases, Inc., was delivered by the pump to an ISCO™ SFX-2-10 supercritical fluid extractor.

This system allowed for static and/or dynamic operation to be carried out by opening and closing the outlet valve.

Under dynamic operation, the exit gas was regulated to a flow of 1.5 mL/min through and ISCO heated restrictor which is controlled by an ISCO Restrictor Temperature Controller.

The samples were placed in a 10 mL aluminum cell which was then fitted into the ISCO extractor for treatment.

During a typical run, the sample was placed in the 10 mL aluminum cell, which was fitted into the extractor that had been previously heated to the desired treatment temperature. The cell was then filled and pressurized with the fluid mixture to be delivered by the syringe pump. The cell was held at the static pressure for 30 minutes when that step was used.

After 30 minutes the exit valve was opened and the mixture was allowed to exit the treatment cell at a rate of 1.5

TABLE 1

| Run | Supercritical Components | Type of Photo Resist | Pressure | Temperature | Contact Protocol |
|---|---|---|---|---|---|
| 1 | 100% carbon dioxide | Positive | 5,000 psi | 90° C. | 30 min static, 30 min dynamic in 10 mL |
| 2 | 100% carbon dioxide | Positive | 5,000 psi | 90° C. | 30 min static, 30 min dynamic in 10 mL |
| 3 | None followed by 100% propylene carbonate followed by 100% carbon dioxide | Negative | N/A | 60° C. | 60 min oven bake with no supercritical fluid, followed by 15 min oven bake with propylene carbonate |
| 4 | 100% propylene carbonate followed by 100% carbon dioxide | Negative | 5,000 psi | 90° C. | 120 min oven bake with propylene carbonate followed by 30 min oven bake with propylene carbonate |
| 5 | 5% propylene carbonate in carbon dioxide followed by 100% carbon dioxide | Positive | 5,000 psi 3,000 psi | 90° C. 40° C. | 30 min static, 30 min dynamic with 5% propylene carbonate, in 10 mL, 15 min dynamic with 100% carbon dioxide in 60 L |
| 6 | 5% propylene carbonate in carbon dioxide followed by 100% carbon dioxide | Negative | 5,000 psi 4,000 psi | 90° C. 58° C. | 30 min static with 5% propylene carbonate in 10 mL, 40 min dynamic in 60 L |
| 7 | 5% propylene carbonate in carbon dioxide followed by 100% carbon dioxide | Negative | 1,200 psi 3,000 psi | 90° C. 51° C. | 30 min static, 30 min dynamic with 5% propylene carbonate, in 10 mL, 15 min dynamic with 100% carbon dioxide in 60 L |
| 8 | 5% propylene carbonate in carbon dioxide | Negative | 4,000 psi | 40° C. | 30 min static, 30 min dynamic, in 10 mL |
| 9 | 5% propylene carbonate in carbon dioxide | Negative | 4,000 psi | 75° C. | 30 min static, 30 min dynamic, in 10 mL |
| 10 | 5% propylene carbonate in carbon dioxide | Negative | 5,000 psi | 90° C. | 30 min static, 30 min dynamic, in 10 mL |
| 11 | 5% propylene carbonate in carbon dioxide | Negative | 1,200 psi | 90° C. | 30 min static, 30 min dynamic, in 10 mL |
| 12 | 5% propylene carbonate in carbon dioxide | Negative | 1,200 psi | 90° C. | 30 min static, 30 min dynamic, in 10 mL |

Runs 1 through 4 were comparison runs; Runs 5 through 12 were invention runs.

Runs 1, 2, and 4–12 were performed using an ISCO™ 260D syringe pump controlled with a series D controller. For Runs 5, 6 and 7, a larger scrub pump was also used in a separate step.

In Runs 1 and 2, 100% carbon dioxide was delivered by the pump to an ISCO™ SFX-2-10 supercritical fluid extractor.

In Runs 3 and 4, 100% propylene carbonate then 100% carbon dioxide was sequentially delivered by the pump to the ISCO™ SFX-2-10 supercritical fluid extractor.

mL/min for an additional 30 minutes of dynamic flow treatment. During this stage, the syringe pump maintained the pressure at the desired level.

The extract was collected in a vial containing a small amount of water. After the treatment was completed, the sample was removed and analyzed for photoresist removal using nuclear reaction analysis.

In Runs 5, 6 and 7 where the photoresist coated wafer was treated first with a mixture of 5% by volume propylene carbonate in carbon dioxide and then with 100% carbon dioxide, the first treatment was performed in the manner described above in an ISCO™ reactor vessel. Then, for treatment of the photoresist coated wafer with 100% carbon dioxide, a 60-liter capacity Super Scrub™ high pressure vessel with high pressure continuous flow pumping system was used.

A special nozzle assembly was designed to apply the supercritical carbon dioxide to the wafer. The nozzle assembly consisted of four individual outputs directed onto the wafer surface from points 90 degrees apart around the diameter of the wafer holder. The nozzle assembly directed the entire carbon dioxide flow directly onto the wafer surface.

The flow volume of the supercritical carbon dioxide was 3.87 liters per minute, which was the equivalent of 500 pounds per hour. The ultimate pressure in the vessel at the end of the application of carbon dioxide was 3,000 psi.

The temperature of the vessel interior was maintained at 40° C. However, the temperature of the carbon dioxide impinging on the wafer was approximately −15° C. because of the supercooling effect of the expansion of the high pressure gas. It is believed that this instantaneous supercooling effect hardened the photoresist on the wafer before removal could take place.

Results of the runs of this example are shown in Table 2.

TABLE 2

Results of Comparison and Invention Runs

| Run | Results |
|---|---|
| 1 | Resist material appeared unchanged, but wiped off with methyl alcohol |
| 2 | Resist material appeared unchanged, but wiped off with methyl alcohol |
| 3 | After 60 min oven bake and no supercritical fluid, resist would not wipe off; after 15 min oven bake with propylene carbonate, positive resist wiped off, negative resist did not |
| 4 | After 120 min oven bake with propylene carbonate, resist softened; after 30 min dynamic contact with carbon dioxide, resist hardened |
| 5 | After contact with 5% propylene carbonate in carbon dioxide, most of resist wiped off with Chemwipe ™; after 15 min contact with 100% carbon dioxide, propylene carbonate coating was left on wafers |
| 6 | After 30 min contact with 5% propylene carbonate in carbon dioxide, a thin film of resist remained; after 40 min contact with carbon dioxide, a thin film of resist remained |
| 7 | After 30 min static and 30 min dynamic contact with 5% propylene carbonate in carbon dioxide, positive resist softened in propylene carbonate, negative resist did not; after 15 min dynamic contact with 100% carbon dioxide, a thin film of resist still remained and hardened upon cooling |
| 8 | After 30 min static and 30 min dynamic contact with 5% propylene carbonate in carbon dioxide, there was slight etching of resist |
| 9 | After 30 min static and 30 min dynamic contact with 5% propylene carbonate in carbon dioxide, there was increased bubbling of resist |
| 10 | After 30 min static and 30 min dynamic contact with 5% propylene carbonate in carbon dioxide, the surface of the resist was dulled, resist wiped off with a cloth |
| 11 | After 30 min static and 30 min dynamic contact with 5% propylene carbonate in carbon dioxide, the resist wiped off easily |
| 12 | After 30 min static and 30 min dynamic contact with 5% propylene carbonate in carbon dioxide; the resist wiped off easily |

Results of these runs show that the unique invention composition is needed for successful removal of photoresist materials from semiconductor substrate wafers. Runs 1 and 2 made with only carbon dioxide and Run 3 made with only propylene carbonate demonstrate that either of the invention composition components alone will not be successful in facilitating removal of the photoresist material. Runs 5, 6 and 7 using a mixture of propylene carbonate and carbon dioxide followed by treatment with only supercritical carbon dioxide were unsuccessful because the photoresist material which was softened and debonded in the first step was allowed to re-harden on the substrate prior to application of the wash with pure supercritical carbon dioxide.

The increased success of Runs 10, 11 and 12 over Runs 8 and 9 is believed attributable to the higher temperature and diffusion conditions used. It is believed that if the pressure and/or temperature were varied or concentrations of propylene carbonate were varied, lower temperatures such as those used in Runs 8 and 9 could be used successfully.

While the compositions, processes and articles of manufacture of this invention have been described in detail for the purpose of illustration, the inventive compositions, processes and articles are not to be construed as limited thereby. The claims of this patent are intended to cover all changes and modifications within the spirit and scope thereof.

INDUSTRIAL APPLICABILITY

The invention compositions and processes can be used for removing photoresist materials from both metallized and nonmetallized substrates during manufacture of electronic parts, particularly semiconductor chips and wafers. The invention compositions and processes can also be used for applications in other manufacturing processes requiring photoresist masking, such as the production of optical waveguides and flat-panel displays.

What is claimed is:

1. A composition for removing photoresist materials and other plastics from substrates comprising a mixture of:

(a) at least one dense phase fluid; and
    (b) at least one dense phase fluid modifier selected from the group consisting of propylene carbonate, ethylene carbonate, butylene carbonate, propylene glycol methyl ether acetate.

2. The composition recited in claim 1 wherein said dense phase fluid is one selected from the group of carbon dioxide, argon, helium, nitrogen, ethane, methane, propane and butane.

3. The composition recited in claim 1 wherein said dense phase fluid is carbon dioxide.

4. The composition recited in claim 1 wherein said dense phase fluid is argon.

5. The composition recited in claim 1 wherein said dense phase fluid is helium.

6. The composition recited in claim 1 wherein said dense phase fluid is nitrogen.

7. The composition recited in claim 1 wherein said dense phase fluid is ethane.

8. The composition recited in claim 1 wherein said dense phase fluid is methane.

9. The composition recited in claim 1 wherein said dense phase fluid is propane.

10. The composition recited in claim 1 wherein said dense phase fluid is butane.

11. The composition recited in claim 1 wherein said dense phase fluid modifier is present in an amount in the range from greater than 0 percent to about 30 percent, based on total volume of the mixture.

12. The composition recited in claim 1 wherein said dense phase fluid modifier is present in an amount in the range from 0.1 percent to about 20 percent, based on total volume of the mixture.

13. The composition recited in claim 1 wherein said dense phase fluid modifier is present in an amount in the range from 0.2 percent to about 10 percent, based on total volume of the mixture.

14. The composition recited in claim 1 wherein said composition is at a temperature in the range from about 0° C. to about 300° C. and a pressure in the range from about 500 psi to about 10,500 psi.

15. The composition recited in claim 1 wherein said composition is at a temperature in the range from about 15° C. to about 200° C. and a pressure in the range from about 1,000 psi to about 10,000 psi.

16. The composition recited in claim 1 wherein said composition is at a temperature in the range from about 40° C. to about 100° C. and a pressure in the range from about 1,500 psi to about 5,000 psi.

* * * * *

UNITED STATES PATENT AND TRADEMARK OFFICE
CERTIFICATE OF CORRECTION

PATENT NO.      : 6,403,544 B1                                             Page 1 of 1
DATED           : June 11, 2002
INVENTOR(S)     : Leisa B. Davenhall and James B. Rubin It is certified that error appears in the above-identified patent and that said Letters Patent is hereby corrected as shown below:

<u>Title page,</u>
*Attorney, Agent, or Firm,* should read -- Gemma Morrison Bennett --

Signed and Sealed this

Third Day of December, 2002

JAMES E. ROGAN
*Director of the United States Patent and Trademark Office*